US012738893B2

(12) United States Patent
Thinakaran et al.

(10) Patent No.: US 12,738,893 B2
(45) Date of Patent: Sep. 15, 2026

(54) METHODS TO REDUCE MEASURE CURRENT SETTLING TIME IN SMU

(71) Applicant: TEXAS INSTRUMENTS INCORPORATED, Dallas, TX (US)

(72) Inventors: Rajavelu Thinakaran, Bangalore (IN); Gautam Nandi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 457 days.

(21) Appl. No.: 18/240,564

(22) Filed: Aug. 31, 2023

(65) Prior Publication Data

US 2024/0356492 A1 Oct. 24, 2024

(30) Foreign Application Priority Data

Apr. 20, 2023 (IN) ............................ 202341028652

(51) Int. Cl.
*H03F 1/02* (2006.01)
*G01R 1/067* (2006.01)

(52) U.S. Cl.
CPC ...... *H03F 1/0211* (2013.01); *H03F 2200/144* (2013.01); *H03F 2200/462* (2013.01); *H03F 2200/471* (2013.01)

(58) Field of Classification Search
CPC ............. H03F 1/0211; H03F 2200/144; H03F 2200/462; H03F 2200/471; H03F 2203/45674; H03F 3/45192
USPC ................................ 330/102, 252–261, 289
See application file for complete search history.

(56) References Cited

U.S. PATENT DOCUMENTS 6,028,438 A * 2/2000 Gillette .............. G01R 31/3004 327/541
6,828,775 B2 * 12/2004 Chow ................ G01R 31/2844 324/759.01

OTHER PUBLICATIONS

Analog Devices, "1.2 A Programmable Device Power Supply with Integrated 16-Bit Level Setting DACs." pp. 1-66. The date of publication is unknown.

* cited by examiner

*Primary Examiner* — Hieu P Nguyen
(74) *Attorney, Agent, or Firm* — Xianghui Huang; Frank D. Cimino

(57) ABSTRACT

The techniques and circuits, described herein, include solutions for reducing measure current settling time in source measurement units (SMUs) during a force voltage mode of operation. An SMU includes a force amplifier having a first voltage input, a second voltage input, a feedback voltage input, and a output. A resistor has a first terminal coupled to the output of the force amplifier, and a second terminal. A switch is coupled between the second terminal of the resistor and the feedback voltage input of the force amplifier. The switch is closed in the force voltage mode, creating a feedback path which the resistor is contained within. A series combination of a capacitor and a resistor is coupled to a gate of a transistor within the force amplifier, which results in improved measure current settling time compared to alternative techniques.

20 Claims, 6 Drawing Sheets

METHODS TO REDUCE MEASURE CURRENT SETTLING TIME IN SMU

CROSS-REFERENCE TO RELATED APPLICATION

This application claims the benefit of India Provisional Application number 202341028652, filed on Apr. 20, 2023, the contents of which are hereby incorporated by reference in their entirety.

BACKGROUND

A source measurement unit (SMU) is a device that combines a sourcing function and a measurement function on a single pin or connector. The SMU can source voltage or current to the pin and measure, e.g., simultaneously, a voltage on the pin or current through the pin. For example, SMUs are used in semiconductor test equipment to run tests by applying predetermined voltage or current waveforms to a wafer, die, or chip. To conduct such tests, electrical probes of the test equipment are placed into contact with pins, bond pads, or other nodes (which are collectively referred to as "pins" for convenience) on the wafer, die, or chip. Then, the SMU sources voltage or current to the pins and simultaneously measures the voltage on the pins to conduct a test. If the measured voltage matches an expected result, then the test passes. Accordingly, the wafer, die or chip is deemed suitably functional. In contrast, if the measured voltage differs from the expected result, then the wafer, die or chip does not exhibit the desired functionality and may be disposed of or sold at a reduced cost. Thus, by simultaneously utilizing the sourcing function and the measuring function, the SMU can be used to test electronic devices under specific conditions and verify correct functionality.

SUMMARY

In one example, a circuit includes an amplifier, a first feedback circuit, a sensing resistor, and a first switch. The amplifier includes a voltage input circuit, and an output driver. The voltage input circuit has a first input, a second input, a first output, and a second output. The output driver has a first input coupled to the first output of the voltage input circuit, a second input coupled to the second output of the voltage input circuit, a feedback input, and an output. The first feedback circuit has a first terminal coupled to the output of the output driver, and a second terminal coupled to the second input of the voltage input circuit. The sensing resistor has a first terminal coupled to the output of the output driver, and a second terminal. The first switch has a first terminal coupled to the second terminal of the sensing resistor, and a second terminal coupled to the feedback input of the output driver.

In another example, a circuit includes an amplifier including a voltage input circuit, an output driver, a first current generator, a first voltage generator, and a first gate driver. The voltage input circuit has a first input, a second input, a first output, and a second output. The output driver has a first input coupled to the first output of the voltage input circuit, a second input coupled to the second output of the voltage input circuit, a third input, a feedback input, and an output. The first current generator has an input coupled to a first feedback terminal of the output driver, and an output. The first voltage generator has an input coupled to the output of the first current generator, and an output. The first gate driver has a first input coupled to the output of the first voltage generator, a second input coupled to a second feedback terminal of the output driver, and an output coupled to the third input of the output driver.

In another example, a circuit includes a force amplifier, a first feedback circuit, a first switch, and a second switch. The force amplifier has a first input, a second input, a feedback input, and an output. The first feedback circuit has a first terminal coupled to output of the force amplifier, and a second terminal coupled to the second input of the force amplifier. The first feedback circuit also includes a sensing resistor having a first terminal coupled to the first terminal of the first feedback circuit, and a second terminal. The first switch has a first terminal coupled to the first terminal of the sensing resistor, and a second terminal coupled to the feedback input of the force amplifier. The second switch has a first terminal coupled to the second terminal of the sensing resistor, and a second terminal coupled to the feedback input of the force amplifier. The force amplifier is configured to operate in a force voltage mode in which a voltage at the output of the force amplifier is constant or a force current mode in which a current at the output of the force amplifier is constant. The first switch is open and the second switch is closed in the force voltage mode, and the first switch is closed and the second switch is open in the force current mode.

DETAILED DESCRIPTION

The drawings are not drawn to scale.

A source measurement unit (SMU) is a type of electronic instrument used to precisely source and measure electronic signals. SMUs can source or provide a controlled voltage or current at an output, while simultaneously measuring a voltage and/or current at the output. An example SMU is capable of providing both positive and negative voltages at the output, as well as both sourcing and sinking current to the output. By providing a controlled voltage/current and measuring the current/voltage response, the SMU can "test" a device connected to the output. Based on the measured response, the current-voltage (IV) characteristics of the device can be characterized, which can indicate properties of the device (e.g., a threshold voltage) and verify that the device is functioning as expected. In some examples, one or more SMUs are included in a tester, such as an automatic test equipment (ATE), memory tester, or another suitable type of tester.

Figure 1:
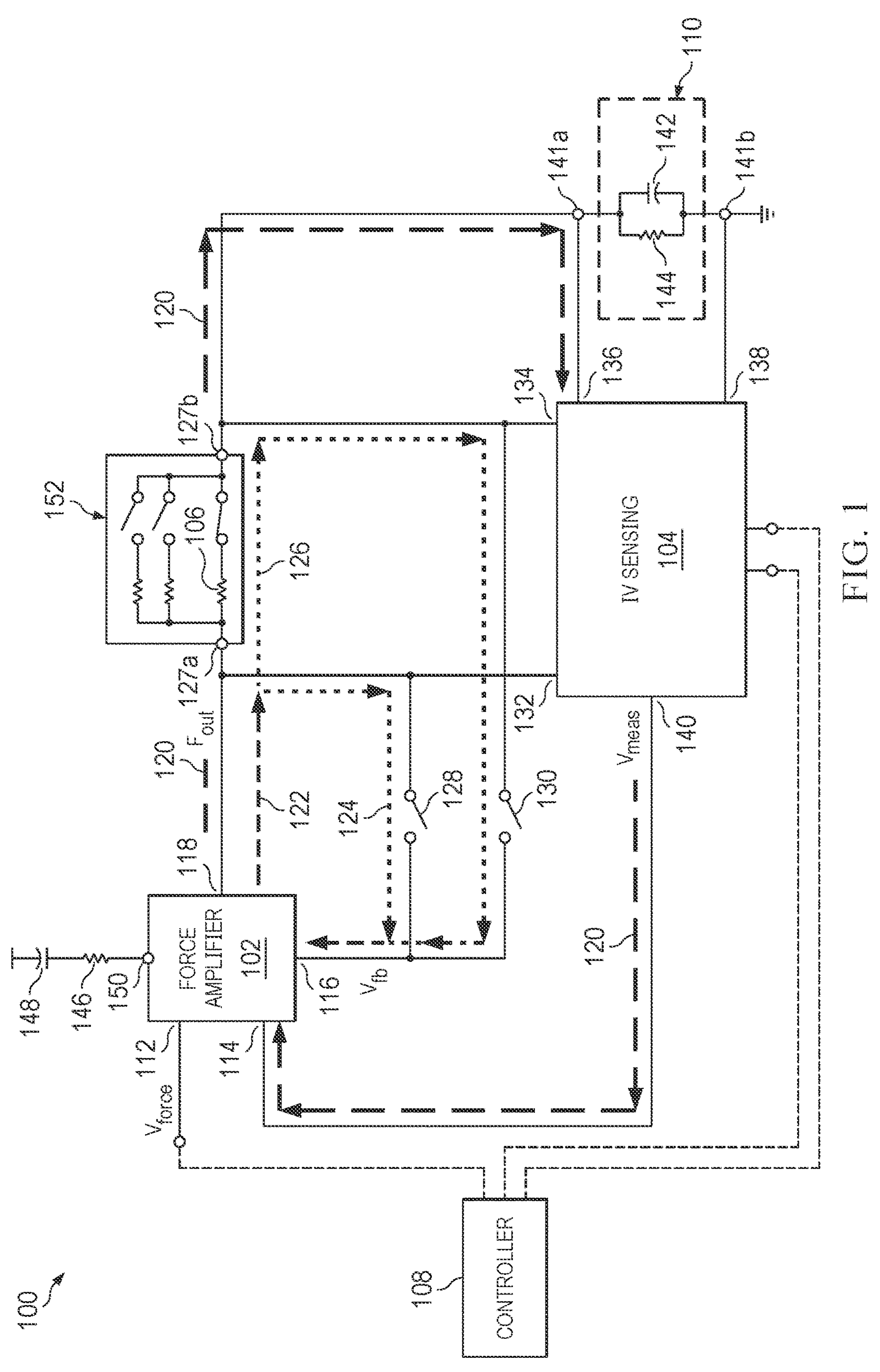
FIG. 1 is a circuit schematic illustrating an example source measurement unit (SMU) including an example of a force amplifier with first and second feedback paths.

FIG. 1 illustrates an example of an SMU 100. As shown, the SMU 100 includes a force amplifier 102, a current voltage (IV) sensing circuit 104, a (first) resistor 106, a (first) switch 128, a (second) switch 130, a (second) resistor 146, a (first) capacitor 148, and a resistor array 152 including a (first) resistor 106. Further illustrated is a controller 108 and a device under test 110 coupled to the SMU 100. The device under test 110 is represented by a (third) resistor 144 and a (second) capacitor 152. In some examples, the force amplifier 102, the IV sensing circuit 104, and the resistor 106 are part of a same semiconductor substrate or "chip", and the device under test 110 is external to the SMU chip, and coupled to the SMU 100 via terminals or pins. Furthermore, the controller 108 may be on the same chip, or external to the chip.

The force amplifier 102 has a (first) voltage input 112, a (second) voltage input 114, a (third) voltage input 116, an output 118, and a gate terminal 150. The voltage input 112 is coupled to the controller 108, and receives a voltage $V_{force}$. The force amplifier 102 provides a signal $F_{out}$ at the output 118.

A (first) feedback path 120, which may also be referred to as a (first) feedback circuit, extends from the output 118 to the voltage input 114. A (second) feedback path 122 extends from the output 118 to the voltage input 116. The feedback path 122 includes a (first) sub-path 124 and a (second) sub-path 126. The sub-paths 124, 126 begin at a (first) terminal 127*a* and a (second) terminal 127*b* of the resistor 106 respectively, and extend to the voltage input 116. The switch 128 is arranged along the sub-path 124, and the switch 130 is arranged along the sub-path 126. A first terminal of the switch 128 is coupled to the terminal 127*a* of the resistor 106, and a second terminal of the switch 128 is coupled to the voltage input 116. A first terminal of the switch 130 is coupled to the terminal 127*b* of the resistor 106, and a second terminal of the switch 130 is coupled to the voltage input 116. The feedback path 122, the sub-path 124, and the sub-path 126 may also be referred to as a (second) feedback circuit, a (first) sub-circuit, and a (second) sub-circuit respectively. In some examples, the switches 128, 130 are part of a same semiconductor substrate or chip as the force amplifier 102.

The IV sensing circuit 104 is arranged along the feedback path 120. The IV sensing circuit 104 has a (first) voltage input 132, a (second) voltage input 134, a (third) voltage input 136, a (fourth) voltage input 138, and a voltage output 140. The voltage input 132 is coupled to the terminal 127*a* of the resistor 106, and the voltage input 134 is coupled to the terminal 127*b* of the resistor 106. The voltage input 136 is coupled to a (first) terminal 141*a* of the device under test 110. The voltage input 138 is coupled to a (second) terminal 141*b* of the device under test 110, and the voltage output 140 is coupled to the voltage input 114 of the force amplifier 102. Furthermore, the IV sensing circuit 104 may also have a current sense output and a voltage sense output coupled to the controller 108 in order to provide measured current and voltage values to the controller 108.

The resistor 146 has a first terminal coupled to the gate terminal 150, and a second terminal. The capacitor 148 has a first terminal coupled to the second terminal of the resistor 146, and a second terminal coupled to a supply voltage.

In the illustrated example, the SMU 100 is capable of a sourcing function and a measuring function. The sourcing and measuring functions may be controlled by the controller 108, for example, by providing control signals to the force amplifier 102, the IV sensing circuit 104, and the switches 128, 130. Although not illustrated in FIG. 1 for simplicity, the controller 108 may be coupled to the force amplifier 102, the IV sensing circuit 104, the switch 128, and/or the switch 130 via one or more connections that carry control signals to control operation of the force amplifier 102, the IV sensing circuit 104, the switch 128, and/or the switch 130.

The SMU 100 may be used to characterize or verify the functionality of (e.g., "test") the device under test 110. In the illustrated example, the device under test 110 is generalized as having a capacitance and a resistance, represented by a (first) capacitor 142 and a (second) resistor 144. In practice, the device under test 110 may be a specific type of device such as a wafer, a die, a chip, a battery, a photovoltaic cell, etc.

The device under test 110 is coupled to the output 118 of the force amplifier 102, where a specific voltage or current is provided. The specific voltage or current may be selected by the controller 108 using the voltage $V_{force}$. The IV sensing circuit 104 measures a current through the device under test 110 or a voltage across the device under test 110. For example, the sensing circuit simultaneously measures current through the device under test 110 or a voltage across the device under test 110 within a same time frame in which the device under test 110 receives the specific voltage or current from the output 118. The measured current or voltage value may be provided to the controller 108 (e.g., via the output 140). Based on a relationship between the provided voltage/current and the measured current/voltage, an IV curve can be derived (e.g., using the controller 108). The IV curve can be used to understand the behavior of the device, which can be used to verify that the device is functioning as intended. For example, if the device under test 110 is a diode, the IV curve is expected to exhibit a very small current for voltages below a minimum threshold (e.g., 0.7 Volts), and a very large current for voltages greater than the minimum threshold. If such behavior is observed from the IV curve, the functionality of the diode can be verified.

For the measuring function, the IV sensing circuit 104 provides a voltage $V_{meas}$ at the output 140 based on and responsive to voltages received on the voltage inputs 132, 134, 136, 138. The IV sensing circuit 104 may operate in a voltage sensing mode and/or a current sensing mode, and the operating mode may be selected by the controller 108. In the voltage sensing mode, the IV sensing circuit 104 provides the voltage $V_{meas}$ based on and responsive to voltages received on the voltage inputs 136, 138. For example, $V_{meas}$ is equal to a difference in voltages on the voltage inputs 136, 138. As a result, in the voltage sensing mode, the voltage $V_{meas}$ reflects a voltage across the device under test 110. In the current sensing mode, the IV sensing circuit 104 provides the voltage $V_{meas}$ based on and responsive to voltages received on the voltage inputs 132, 134. As a result, in the current sensing mode, the voltage $V_{meas}$ reflects a current through the resistor 106. Accordingly, the resistor 106 may also be referred to as a sensing resistor or a current sensing resistor.

The IV sensing circuit 104 may be assumed to draw little to no current at the voltage inputs 132, 134, 136, 138. Thus, the current through the resistor 106 is approximately equal to the current through the device under test 110, since the resistor 106 is arranged in series with the device under test 110 between the output 118 and the terminal 141*b*. Further, since the IV sensing circuit draws very little current on the voltage inputs 132, 134, 136, 138, the IV sensing circuit 104 can measure the current through the device under test 110 or the voltage across the device under test 110 without affecting (e.g., causing a drop in) the current/voltage.

For the sourcing function, the force amplifier 102 provides the signal $F_{out}$ at the output 118 based on and responsive to the value of $V_{force}$. The signal $F_{out}$ may be a constant voltage or a constant current, depending on a mode of operation of the force amplifier 102. The signal $F_{out}$ may be further based on and responsive to voltages received on the voltage inputs 114, 116. For example, the force amplifier 102 receives the signal $V_{meas}$ on the voltage input 114 along the feedback path 120, and adjusts the output 118 responsive to a comparison between $V_{force}$ and $V_{meas}$ in order to maintain the constant voltage or constant current. Furthermore, the force amplifier 102 may adjust the output 118 based on $V_{fb}$. In an example, the force amplifier 102 operates in a force voltage mode, in which the signal $F_{out}$ is a constant voltage. Alternatively, the force amplifier 102 operates in a force current mode, in which the signal $F_{out}$ is a constant current. The operation mode of the force amplifier 102 is selected, for example, by the controller 108. As used herein, the term "constant" refers to a voltage or a current that varies by less than approximately +−0.1% from a particular value.

In certain scenarios, when operating in force voltage mode, a capacitance of the device under test 110 (illustrated as the capacitor 142) can interact with a resistance of the resistor 106 to cause instability in the system. The transfer function in the Laplace domain when considering 127*a* as the input and 127*b* as the output can be modeled by $$H(s) = \frac{1}{1 + sRC}$$

where R is the resistance of the resistor 106, C is the capacitance of capacitor 142, and s is the complex frequency variable. As seen from the transfer function, the capacitor 142 in series with the resistor 106 creates a negative real pole at $$s = -\frac{1}{RC}$$

(e.g., when un denominator is equal to zero), which is also referred to herein as an RC pole. Using the substitution s=jω, where j is an imaginary number and ω is the frequency in radians, the equation can be written as $$\omega = \frac{1}{jRC}.$$

As the frequency ω increases and surpasses $$\frac{1}{jRC},$$

a "delay" (e.g., a phase shift/lag) in the system also increases. The phase lag results in a delay in feedback along the feedback path 120, which may cause the system to become unstable. In order to maintain system stability, the bandwidth of the system can be limited to frequencies lower than the $$\frac{1}{jRC},$$

which is also referred to herein as the RC pole frequency.

The RC pole frequency is a function of C and R. The value of C may vary depending on the capacitance of the device under test 110. The value of R my vary based on a current range the SMU 100 is operating in, which is determined by the current at the output 118. As the RC term increases, the RC pole frequency decreases, which reduces the stable bandwidth of the system. In order to increase system stability and bandwidth, the RC pole can be compensated.

One technique to compensate the RC pole is to add a series combination of a resistor and a capacitor in parallel with the resistor 106. However, in order to effectively compensate the RC pole using this method, the capacitance of the new capacitor may be quite large (e.g., up to ~2 microfarads (uF)). Introducing a large capacitor in parallel with the resistor 106 can delay a change in voltage across the resistor 106, since the capacitor must charge/discharge before "settling" at a new voltage. In the context of the SMU 100, the new capacitor may cause a delay in current measurement (e.g., by the IV sensing circuit 104) when a voltage across the resistor 106 has recently changed, since the current measurement is performed by sensing the voltage across the resistor 106. The time taken for the current measurement to settle after a change in system conditions is referred to as measure current settling time. The measured current may be considered "settled" when the measured current value varies by less a predetermined amount such as +−0.1%, +−0.05%, or another suitable value, for a predetermined duration. In an example, the controller 108 tracks the predetermined amount and the predetermined duration. In order to improve SMU efficiency by reducing device testing time and increasing device testing throughput, it is desirable that the measure current settling time be minimized. Therefore, an alternative method of compensating the RC pole is desired.

The present description provides techniques and circuitry for compensating the RC pole and minimizing measure current settling time. The force amplifier 102 receives the feedback voltage $V_{fb}$ on the voltage input 116, which is also referred to as a feedback voltage input. To compensate the RC pole, in the force voltage mode, the switch 130 is closed and the switch 128 is opened (e.g., by the controller 108), and $V_{fb}$ reflects the voltage at the terminal 127*b* of the resistor 106. In contrast, in the force current mode, the switch 130 is opened and the switch 128 is closed (e.g., by the controller 108), and $V_{fb}$ reflects the voltage at the terminal 127*a* of the resistor 106.

In the force voltage mode, by closing the switch 130 and opening the switch 128, the resistor 106 is contained within the sub-path 126 of the feedback path 122, and therefore can be considered internal to the force amplifier 102 for the purpose of analysis. By closing the switch 130 and opening the switch 128 to create the sub-path 126, the output impedance at the node 127*b* becomes $1/G_m$, where $G_m$ is a transconductance of an output stage of the force amplifier 102. In contrast, when the switch 130 is open and the switch 128 is closed, the output impedance at the node 127*b* becomes $1/G_m+R_{sense}$, where $R_{sense}$ is the resistance of the resistor 106. When both the switch 128 and 130 are open, the output of impedance of the force amplifier 102 at node 127*a* is not dependent on $G_m$ and may be represented by a resistance $R_{ds}$.

Thus, the example of FIG. 1 can be analyzed as an impedance of $1/G_m$ in series with the capacitor 142 with capacitance C. The resulting transfer function is $$H(s) = \frac{1}{s\frac{C}{G_m} + 1},$$

and the resulting pole is $$-\frac{G_m}{C},$$

which is also referred to herein as a $G_mC$ pole. Unlike the RC pole, the $G_mC$ pole is independent of the resistance R of the resistor 106. Further, when considering some values for $G_m$ and R, the $G_mC$ pole occurs at a significantly higher frequency when compared to the RC pole. For example, the value of $G_m$ is greater than $20*10^{-3}$ Siemens(S), and the resistance R of the resistor 106 is a large value such as $200*10^3$ Ohms. In the above example, the $G_mC$ pole frequency is approximately 4000 times higher than the RC pole frequency. The increased pole frequency when compared to the RC pole results in reduced phase lag at lower frequencies, which increases the stable bandwidth of the system.

In addition, the stable bandwidth of the system may further be improved by compensating the $G_mC$ pole. Unlike the RC pole, the $G_mC$ pole frequency is approximately the same for all current ranges, since the $G_mC$ pole is independent of R (which may vary depending on the selected current range). Therefore, the $G_mC$ pole can be compensated using a single capacitor for all current ranges. In the example of FIG. 1, the $G_mC$ pole is compensated by adding the series combination of the resistor 146 and the capacitor 148 that is coupled to the gate terminal 150 of the force amplifier 102. The gate terminal 150, for example, is coupled to a gate of a transistor within the force amplifier 102. In some examples, the capacitor 148 and the resistor 146 are chosen to compensate the $G_mC$ pole for a maximum expected value of C (e.g., 10 uF). For example, the capacitor 148 and the resistor 146 are chosen according to the equation $$\frac{G_m}{C} = \frac{1}{R_1 C_1},$$

where R1 is the resistance of the resistor 146 and C1 is the capacitance of the capacitor 148. In some examples, the resistor 146 is on a same semiconductor substrate or chip as the force amplifier 102, and the capacitor 148 is external to the chip.

Since no large capacitor is coupled to the resistor 106, the time for the voltage across the resistor 106 to "settle" to obtain accurate current measurements is reduced. In some examples, a small capacitor (e.g., 50 picofarads (pF)) is added in parallel between the terminals 127*a* and 127*b* of the resistor 106 to compensate the phase shift due to a parasitic capacitance at the output 118 of the force amplifier 102. However, since the capacitor size (e.g., 50 pF) is relatively small compared to alternative approaches (e.g., 2 uF), the impact to measure current settling time is also relatively small.

Measure current settling time can be divided into several categories, including load step measure current settling time and range change measure current settling time. Load step measure current settling time refers to the time taken to measure a current through the device under test 110 when the current through the device under test 110 increases or decreases. Range change measure current settling time refers to the time taken to measure the current through the device under test 110 when a current range of the SMU 100 is changed. The SMU 100 may operate in multiple current ranges, and the selected value of the resistor 106 may be different for each current range. For the example illustrated, the resistor 106 is part of the resistor array 152 including N resistors, where N is equal to the total number of current ranges the SMU 100 is configured with. The example resistor array 152 also includes N switches respectively coupled to the N resistors, to select (e.g., couple) the appropriate resistor for the current range.

In some examples, by closing the switch 130 and opening the switch 128 in the force voltage mode, the load step measure current settling time of the SMU 100 is significantly improved (e.g., reduced) compared to alternative techniques. However, relative to the load step measure current settling time, the SMU 100 may exhibit a greater range of change measure current settling time for the same values of R and C. For example, the range change measure current settling time is up to ~10 times greater than the load step measure current settling time. Techniques to further improve the range change measure current settling time will now be described with reference to FIGS. 2A and 2B.

Figure 2A:
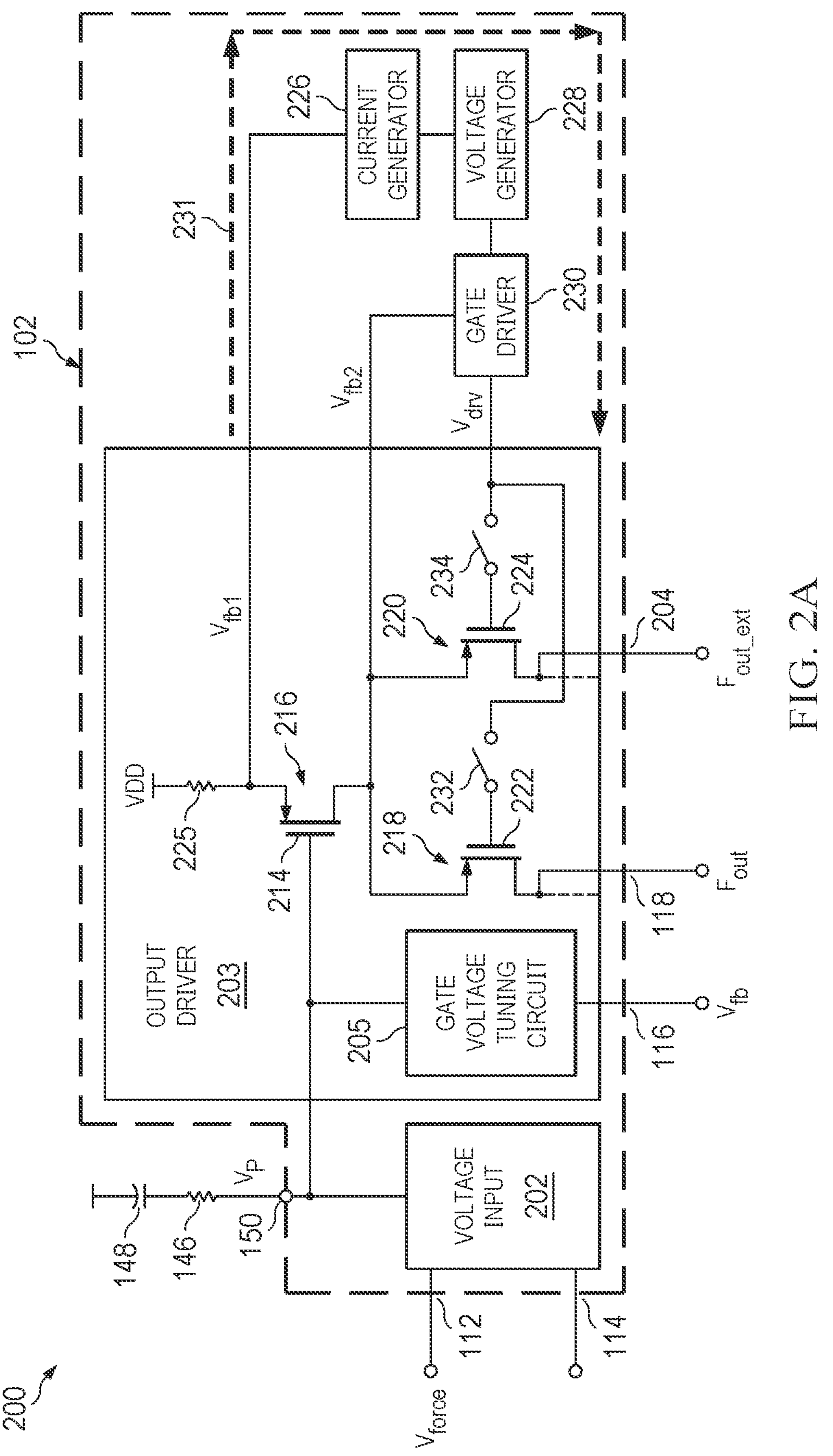
FIGS. 2A and 2B are circuit schematics illustrating examples of a force amplifier including a gate drive feedback loop.
Figure 2B:
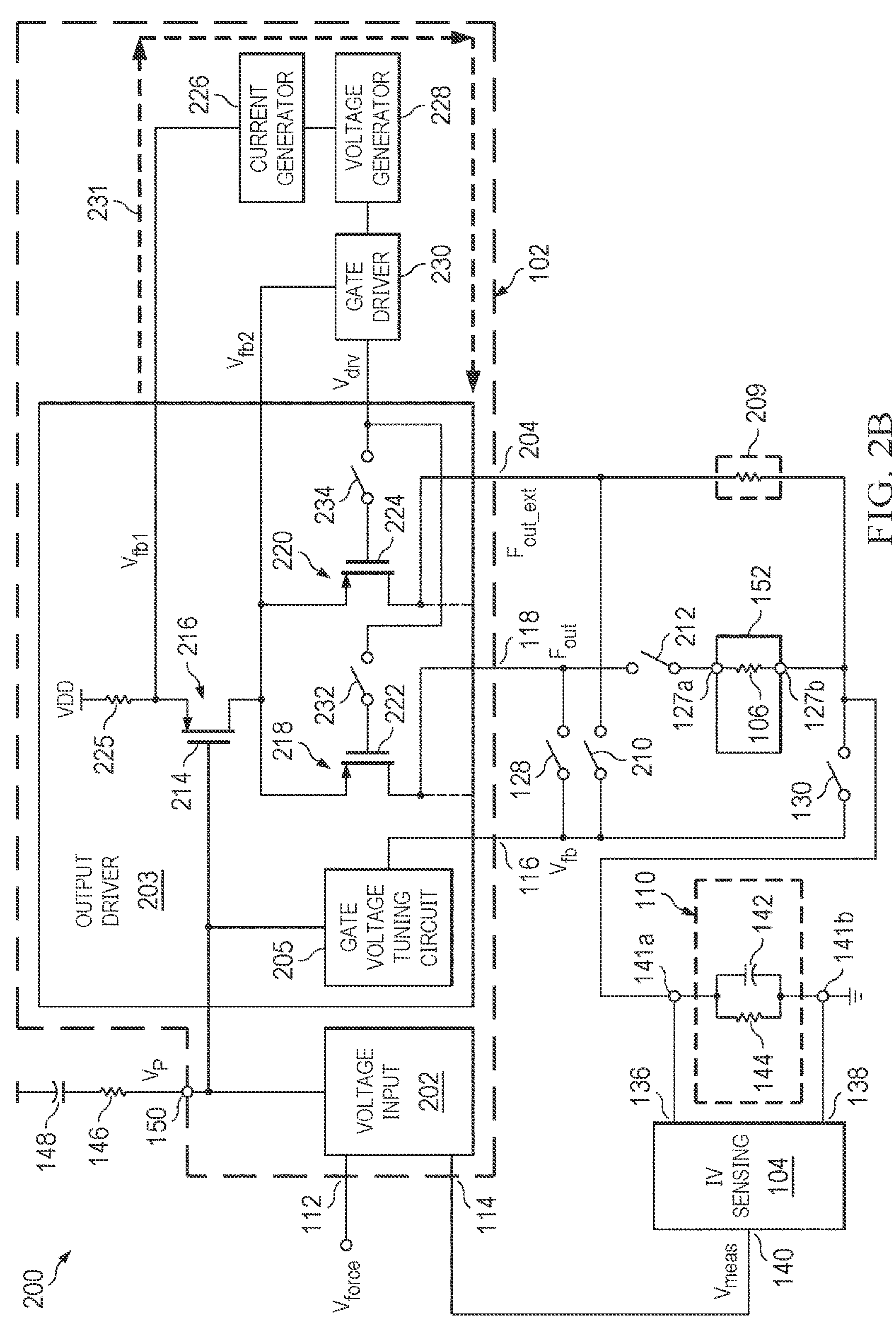

FIGS. 2A and 2B (collectively referred to as FIG. 2) illustrate examples of an SMU 200. As shown in FIG. 2A, similar to the SMU 100, the SMU 200 includes a force amplifier 102, a resistor 146, and a capacitor 148. The force amplifier 102 includes a voltage input circuit 202, an output driver 203, a current generator 226, a voltage generator 228, and a gate driver 230.

As shown, the output driver 203 includes a (first) transistor 214, a (second) transistor 222, a (third) transistor 224, a (sixth) resistor 225, a (first) switch 232, a (second) switch 234, and a gate voltage tuning circuit 205. The transistor 214 has a first terminal coupled to a supply voltage VDD via the resistor 225, a second terminal, and a control terminal coupled to the first voltage input of the output driver 203. The transistor 222 has a first terminal coupled to the second terminal of the transistor 214, a second terminal coupled to the output 118, and a control terminal. The transistor 224 has a first terminal coupled to the second terminal of the transistor 214, a second terminal coupled to the output 204, and a control terminal.

The voltage input circuit 202 has a first voltage input, a second voltage input, and a first voltage output. The first voltage input of the voltage input circuit 202 is or is coupled to the voltage input 112, and the second voltage input of the voltage input circuit 202 is or is coupled to the voltage input 114. The output driver 203 has a first voltage input coupled to the first voltage output of the voltage input circuit 202, and a first output coupled to the output 118. The output driver 203 further has feedback voltage input that is or is coupled to the voltage input 116. A series combination of the resistor 146 and the capacitor 148 is coupled to the first voltage input of the output driver 203. The voltage at the first voltage input of the output driver 203 is referred to herein as $V_P$. The gate voltage tuning circuit 205 has a voltage input coupled to the voltage input 116, and an output coupled to the first voltage input of the output driver 203. The gate voltage tuning circuit 205 tunes a voltage on a gate of the transistor 214 based on and responsive to the voltage received on the voltage input 116.

The output driver 203 further has a first feedback terminal upon which a voltage $V_{fb1}$ is provided, a second feedback terminal upon which a voltage $V_{fb2}$ is provided, and a drive voltage input upon which a voltage $V_{drv}$ is received. The first feedback terminal is coupled to the first terminal of the transistor 214, the second feedback terminal is coupled to the second terminal of the transistor 214, and the drive voltage input is coupled to the control terminals of the transistors 222, 224.

The current generator 226 has a voltage input that is coupled to the first feedback terminal of the output driver 203, and a current output. The voltage generator 228 has a current input coupled to the current output of the current generator, and a voltage output. The gate driver 230 has a first voltage input coupled to the voltage output of the voltage generator 228, a second voltage input coupled to the second feedback terminal of the output driver 203, and a voltage output coupled to the drive voltage input of the output driver 203.

The switch 232 has a first terminal coupled to the control terminal of the transistor 222, and second terminal coupled to the voltage output of the gate driver 230. The switch 234 has a first terminal coupled to the control terminal of the transistor 224, and a second terminal coupled to the output of the gate driver 230.

In addition to the output 118, the force amplifier 102 of FIG. 2A includes the output 204 upon which a signal $F_{out\_ext}$ is provided. The output 204 is or is coupled to a second output of the output driver 203.

The force amplifier 102 may utilize the output 118 or the output 204 based on and responsive to a current range the force amplifier 102 is operating in. In some examples, the output 118 is used for lower current ranges (e.g., up to 2 milliamps (mA)), and the output 204 is used for higher current ranges (e.g., up to 100 mA). Although the use of multiple outputs such as the outputs 118, 204 allows for more flexible current range configuration, the range change measure current settling time may be increased in certain scenarios, such as when the force amplifier 102 switches between the output 118 and the output 204. The force amplifier 102 may include separate sets of internal circuitry/signal paths that are coupled to the outputs 118, 204 respectively. As shown, the output driver 203 includes the transistor 214, which is arranged along a (first) signal path 216. The signal path 216 splits into a (second) signal path 218 and a (third) signal path 220, which extend to the output 118 and the output 204 respectively. The transistor 222 is arranged along the signal path 218, and the transistor 224 is arranged along the signal path 220. In some examples, the transistors 214, 222, and 224 are p-channel metal oxide semiconductor (PMOS) transistors or the like. In some examples, the transistor 214 is a low voltage (e.g., 5V) transistor, and the transistors 222, 224 are high voltage (e.g., 48V) transistors. The transistors 222, 224 may be added for high voltage protection purposes.

Since the outputs 118, 204 may be used for different current ranges, the transistors 222, 224 may have different designs to best suit the different current ranges. For example, if the output 204 is used for higher current ranges than the output 118, the transistor 224 may be a larger size than the transistor 222 in order to reduce conductive losses, which are more relevant in the presence of high current. Furthermore, a different bias voltage may be used at the control terminals (e.g., gates) of the transistors 222, 224 in order to best suit the different current ranges. For example, the bias voltage may increase as the current range increases, and vice versa. The change between different bias voltages used for the transistors 222, 224 when switching between the outputs 118, 204 causes a disturbance in the voltage at the control terminal (e.g., gate) and the second terminal (e.g., drain) of the transistor 214. This disturbance is due to the coupling between the transistors 222, 224 and the transistor 214. After being disturbed, the voltages on the drain and gate of the transistor 214 settle according to a time constant determined by a resistance of the resistor 146 and a capacitance of the capacitor 148. In some examples, the settling time is as great as ~250 microseconds (us).

The range change measure current settling time, specifically when switching between the output 118 and the output 204, can be improved using the biasing scheme illustrated in FIG. 2. As shown, the force amplifier includes the current generator 226, the voltage generator 228, and the gate driver 230 arranged along a feedback loop 231, which is also referred to as a gate drive feedback loop.

The gate bias of the transistors 222, 224 is controlled using a combination of the current generator 226, voltage generator 228, and gate driver 230 that are arranged along the feedback loop 231. The current generator 226 is configured to generate a current based on and responsive to the current at the output 118 or the output 204. The current generator receives the voltage $V_{fb1}$, which is a function of the current at the output 118 or the output 204, depending on which output is currently being used by the force amplifier 102. The voltage generator 228, which is coupled to the current generator 226, is configured to generate a voltage based on the current generated by the current generator 226. The gate driver 230, which is coupled to the voltage generator, is configured to provide the voltage $V_{drv}$, which may be used to bias the control terminals (e.g., gates) of the transistor 222 and/or the transistor 224. The voltage $V_{drv}$ may be further based on $V_{fb2}$.

Therefore, the voltage $V_{fb1}$ may undergo several level shifts by the current generator 226, the voltage generator 228, and/or the gate driver 230. The gate driver 230 provides the voltage $V_{drv}$, which is based on $V_{fb1}$ and $V_{fb2}$, to the transistor 222 or the transistor 224. For example, a controller (e.g., the controller 108) may selectively open/close the switch 232 and the switch 234 of the output driver 203 to provide $V_{drv}$ to the desired transistor.

The feedback loop 231 is designed such that $V_{fb2}$ (e.g., the drain voltage of the transistor 214) is a function of the output current. For example, the feedback loop 231 adjusts $V_{drv}$ such that $V_{fb2}$ is equal to the voltage output of the voltage generator 228 (which is a function of output current). Therefore, for a given output current, the value of $V_{fb2}$, and therefore the value of $V_{drv}$, is the same regardless of whether the output 118 or the output 204 is used. This creates a more smooth/gradual change in bias voltages when switching between the outputs 118, 204. By smoothing the change between bias voltages when switching between the outputs 118, 204, the voltage disturbance at the drain/gate of the transistor 214 is reduced, thereby improving the range change measure current settling time. In addition, since $V_{fb2}$ is a function of the output current, at higher output current a drain-source voltage of the transistor 214 is increased by reducing $V_{drv}$. As a result, the transistors 214, 222, 224 can be optimized to occupy minimal area on the chip, which is beneficial since the transistors 214, 222, 224 can be relatively large in order to support high voltages and/or minimal conductive losses.

As shown in FIG. 2B, the example SMU 200 includes the force amplifier 102, the IV sensing circuit 104, the device under test 110, the switch 128, the switch 130, the resistor 146, the capacitor 148, and the resistor array 152 including the resistor 106, which are operably coupled as shown. In some examples, the force amplifier 102, the IV sensing circuit 104, the device under test 110, the switch 128, the switch 130, the resistor 146, the capacitor 148, and the resistor array 152 perform similar functions as described with reference to FIG. 1. The SMU 200 further includes a (third) resistor 209, a (third) switch 210, and a (fourth) switch 212, The resistor 209 has a first terminal coupled to the output 204 and a second terminal coupled to the terminal 141*a* of the device under test 110, as shown. The switch 210 has a first terminal coupled to the first terminal of the resistor 209, and a second terminal coupled to the voltage input 116. The switch 212 is coupled between the output 118 and the resistor 106, such that a first terminal of the switch 212 is coupled to the output 118 and a second terminal of the switch 212 is coupled to the terminal 127*a* of the resistor 106. The terminal 127*b* of the resistor 106 is coupled to the device under test 110, which is illustrated as having a (fifth) resistor 144 with a resistance R and a (second) capacitor 142 with a capacitance C. In some examples, the switch 212 is closed when utilizing the output 118, and is open when utilizing the output 204.

In some examples, when the output 118 is being utilized, the IV sensing circuit 104 measures a voltage across the resistor 106, which reflects a current at the output 118 and through the device under test 110. When the output 204 is being utilized, the IV sensing circuit 104 measures a voltage across the resistor 209, which reflects a current at the output 204 and through the device under test 110. The IV sensing circuit 104 may provide the voltage $V_{meas}$ based on and responsive to the measured voltage across the resistor 106 or the resistor 209. The voltage $V_{meas}$ may be received by the force amplifier 102 and/or a controller (e.g., the controller 108). Although not shown for simplicity, the IV sensing circuit 104 may have voltage inputs coupled to terminals of the resistor 106 and/or the resistor 209 to measure voltage across the resistor 106 and/or the resistor 209. Further details can be found, for example, in FIG. 4.

In some examples, the resistor array 152 is on a same semiconductor substrate or chip as the force amplifier 102, and the resistor 209 is external to the chip. The resistor 209 may be coupled to terminal(s) or pin(s) of the SMU 200 to create the circuit shown in FIG. 2B. By making the resistor 209 off-chip, the value of the resistor 209 may be changed more flexibly to better suit different current ranges.

Figure 3A:
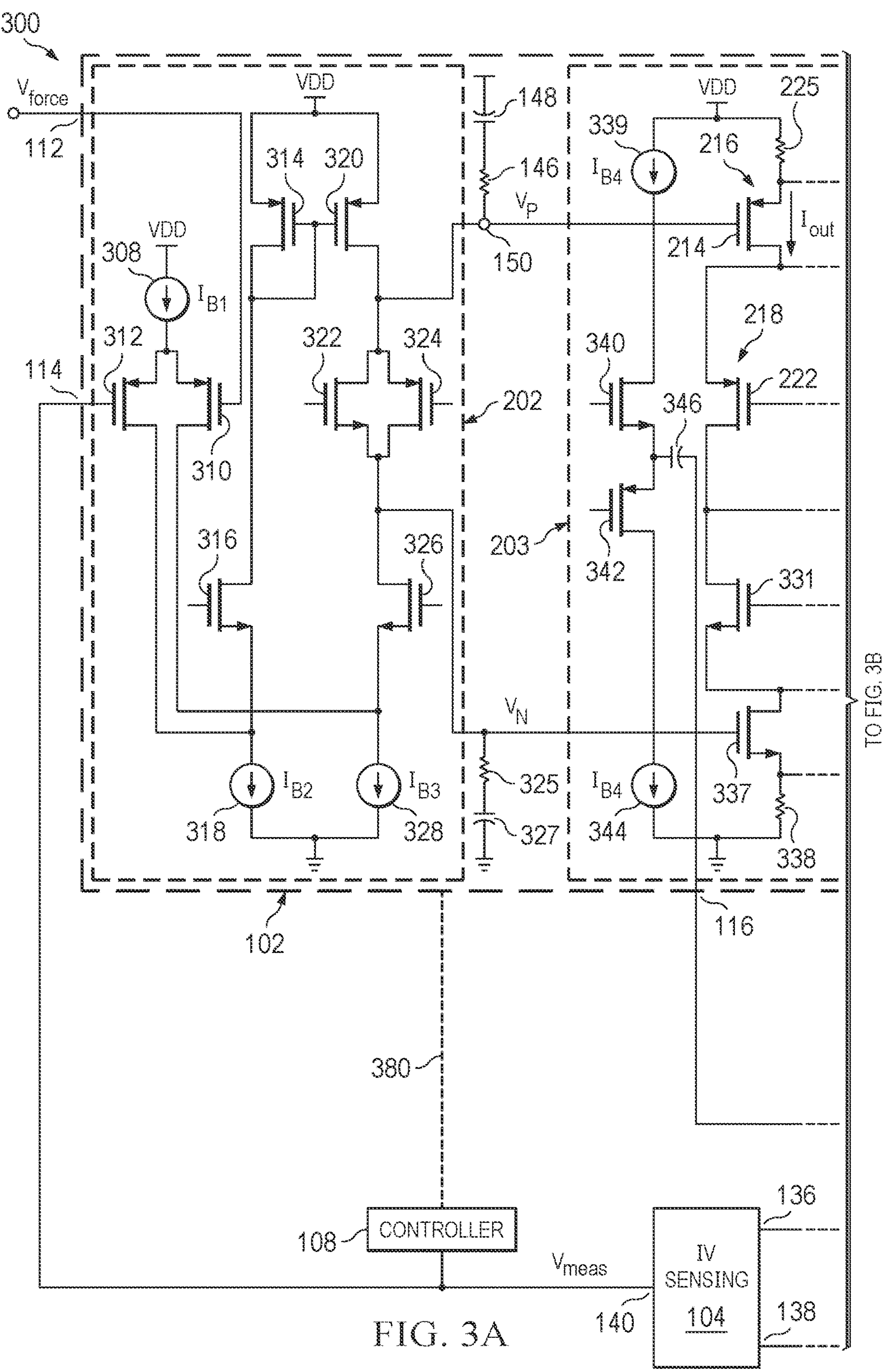
FIGS. 3A-3B are circuit schematics illustrating further details of the circuit of FIG. 1 and/or FIGS. 2A and 2B.
Figure 3B:
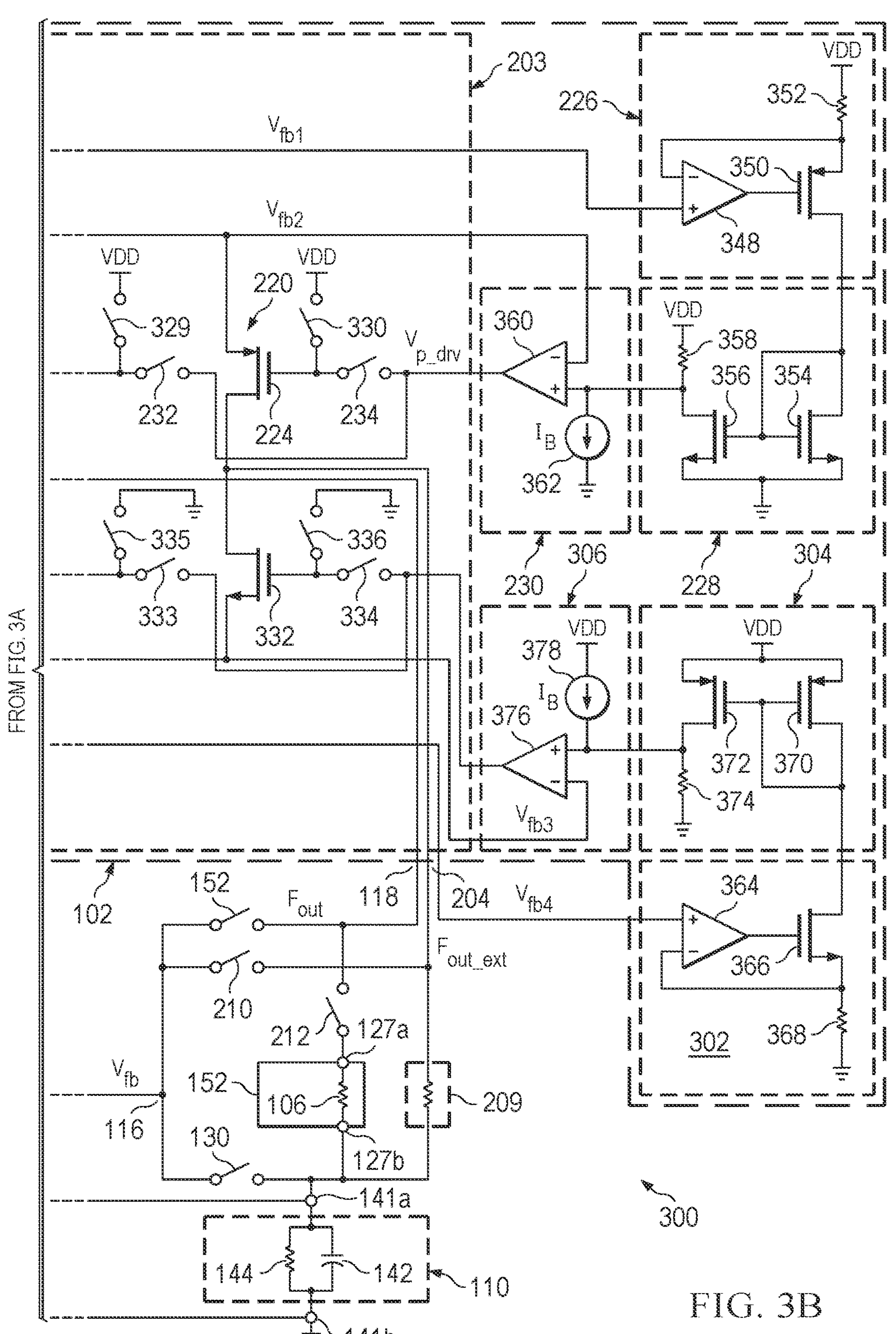

FIGS. 3A-3B (collectively referred to as FIG. 3) illustrate an example of an SMU 300. In some examples, the SMU 300 corresponds to a more detailed version of the SMU 100 or the SMU 200, and contains similarly numbered elements with similar functionalities as those previously described.

In the example of the SMU 300, the force amplifier 102 includes the voltage input circuit 202, the output driver 203, the (first) current generator 226, the (first) voltage generator 228, and the (first) gate driver 230. However, the example of FIG. 3 further includes a (second) current generator 302, a (second) voltage generator 304, and a (second) gate driver 306. The current generator 302, voltage generator 304, and gate driver 306 may function similarly to the current generator 226, voltage generator 228, and gate driver 230. For example, the current generator 226, voltage generator 228, and gate driver 230 are used to drive a PMOS stage of the output driver 203, and the current generator 302, voltage generator 304, and gate driver 306 are used to drive an n-channel metal oxide semiconductor (NMOS) stage of the output driver 203.

The voltage input circuit 202 includes a (first) current source 308, a (first) transistor 310, a (second) transistor 312, a (third) transistor 314, a (fourth) transistor 316, a (second) current source 318, a (fifth) transistor 320, a (sixth) transistor 322, a (seventh) transistor 324, an (eighth) transistor 326, and a (third) current source 328, which are operably coupled as shown.

In the example of FIG. 3, the current source 308 has a first terminal coupled to a supply voltage VDD, and a second terminal. The transistor 310 has a first terminal coupled to the second terminal of the current source 308, a second terminal, and a control terminal coupled to the voltage input 112. The transistor 312 has a first terminal coupled to the second terminal of the current source 308, a second terminal, and a control terminal coupled to the voltage input 114. The transistor 314 has a first terminal coupled to the supply voltage VDD, a second terminal, and a control terminal coupled to the second terminal. The transistor 316 has a first terminal coupled to the second terminal of the transistor 314, a second terminal, and a control terminal. The current source 318 has a first terminal coupled to the second terminal of the transistor 316, and a second terminal coupled to ground. The transistor 320 has a first terminal coupled to the supply voltage VDD, a second terminal coupled to the first voltage output of the voltage input circuit 202 (e.g., the node with $V_P$), and a control terminal coupled to the control terminal of the transistor 314. The transistor 322 has a first terminal coupled to the second terminal of the transistor 320, a second terminal, and a control terminal. The transistor 324 has a first terminal coupled to the second terminal of the transistor 320, a second terminal coupled to the second terminal of the transistor 322, and a control terminal. The transistor 326 has a first terminal coupled to the second terminal of the transistor 322 and coupled to a second voltage output of the voltage input circuit 202 (e.g., the node with $V_N$), a second terminal coupled to the second terminal of the transistor 310, and a control terminal. The current source 328 has a first terminal coupled to the second terminal of the transistor 326, and a second terminal coupled to ground.

In some examples, the current sources 308, 318, 328 source currents IB1, IB2, and IB3 respectively. In some examples, the value of IB1 and the capacitor 146 are chosen to achieve a desired gain bandwidth of the force amplifier, where the gain bandwidth is given by a transconductance of the transistor 312 divided by a capacitance of the capacitor 346. In some examples, IB1=IB2=IB3. However, in alternative examples, IB1, IB2, and IB3 are different values.

Similar to FIGS. 1-2, a series combination of the resistor 146 and the capacitor 148 is coupled to the first voltage output of the voltage input circuit 202. In addition, the example of FIG. 3 includes a series combination of a resistor 325 and a capacitor 327 coupled to the second voltage output of the voltage input circuit 202. The series combination of the resistor 325 and the capacitor 327 may function similarly to the series combination of the resistor 146 and the capacitor 148 and stabilize the force voltage loop by compensating the $G_mC$ pole. In some examples, $G_m$ is approximately equal to $$(G_{m2} + G_{m3}) * \frac{C_2}{C_p + C_n}.$$

$G_{m2}$ is the transconductance of the transistor 214, $G_{m3}$ is the transconductance of the transistor 337, $C_2$ is the capacitance of the capacitor 346, $C_P$ is the parasitic capacitance at $V_P$, and $C_B$ is the parasitic capacitance at $V_N$.

Similar to FIGS. 2A and 2B, the output driver 203 includes the (first) resistor 225, the (first) switch 232, the (second) switch 234, the (first) transistor 214, the (second) transistor 222, and the (third) transistor 224, which are operably coupled as shown. The switch 232 has a first terminal coupled to the control terminal of the transistor 222, and a second terminal coupled to the first drive voltage input of the output driver 203. The switch 234 has a first terminal coupled to the control terminal of the transistor 224, and a second terminal coupled to the first drive voltage input of the output driver 203. The first drive voltage input of the output driver 203 is coupled to the voltage output of the gate driver 230 and receives the voltage $V_{p\_drv}$.

The output driver 203 of FIG. 3 further includes a (third) switch 329, a (fourth) switch 330, a (fourth) transistor 331, a (fifth) transistor 332, a (fifth) switch 333, a (sixth) switch 334, a (seventh) switch 335, an (eighth) switch 336, a (sixth) transistor 337, a (second) resistor 338, a (first) current source 339, a (seventh) transistor 340, an (eighth) transistor 342, a (second) current source 344, and a (first) capacitor 346.

The switch 329 has a first terminal coupled to the control terminal of the transistor 222, and a second terminal coupled to the supply voltage VDD. The switch 330 has a first terminal coupled to the control terminal of the transistor 224, and a second terminal coupled to the supply voltage VDD. In some examples, the switches 329, 330 operate complementary to the switches 232, 234. Accordingly, when the switch 329 is open, the switch 232 is be closed, and vice versa. Similarly, when the switch 330 is open, the switch 234 is closed, and vice versa.

The transistor 331 has a first terminal coupled to the second terminal of the transistor 222, a second terminal, and a control terminal. The transistor 332 has a first terminal coupled to the second terminal of the transistor 224, a second terminal, coupled to the second terminal of the transistor 331, and a control terminal. The switch 333 has a first terminal coupled to the control terminal of the transistor 331, and a second terminal coupled to a second drive voltage input of the output driver 203. The switch 334 has a first terminal coupled to the control terminal of the transistor 331, and a second terminal coupled to the second drive voltage input of the output driver 203. The second drive voltage input of the output driver 203 is coupled to the voltage output of the gate driver 306 and receives the voltage $V_{n\_drv}$. The switch 335 has a first terminal coupled to the control terminal of the transistor 331, and a second terminal coupled to ground. The switch 336 has a first terminal coupled to the control terminal of the transistor 332, and a second terminal coupled to ground. The transistor 337 has a first terminal coupled to the second terminal of the transistor 331 and the second terminal of the transistor 332, a second terminal, and a control terminal coupled to a second voltage input of the output driver 203 (e.g., the node with $V_N$). The resistor 338 has a first terminal coupled to the second terminal of the transistor 337, and a second terminal coupled to ground. The second terminal of the transistor 331 and the second terminal of the transistor 332 are coupled to a third feedback terminal of the output driver 203, upon which a voltage $V_{fb3}$ is provided. The second terminal of the transistor 337 and the first terminal of the resistor 338 are coupled to a fourth feedback terminal of the output driver 203, upon which a voltage $V_{fb4}$ is provided. In some examples, the gate driver 306 is configured to set $V_{fb3}$ equal to the output voltage of the voltage generator 304.

The current source 339 has a first terminal coupled to the supply voltage VDD, and a second terminal. The transistor 340 has a first terminal coupled to the second terminal of the current source 339, a second terminal, and a control terminal. The capacitor 346 has a first terminal coupled to the second terminal of the transistor 340, and a second terminal coupled to the feedback voltage input (e.g., 116) of the output driver 203. The transistor 342 has a first terminal coupled to the second terminal of the transistor 340, a second terminal, and a control terminal. The current source 344 has a first terminal coupled to the second terminal of the transistor 342, and a second terminal coupled to ground. The current source 339 and the current source 344 source the current IB4.

The current generator 226 includes a (first) amplifier 348, a (first) transistor 350, and a (first) resistor 352. The amplifier 348 has a first input coupled to the voltage input of the current generator 226 (e.g., the node with $V_{fb1}$), a second input, and an output. The transistor 350 has a first terminal coupled to the second input of the amplifier 348, a second terminal coupled to the current output of the current generator 226, and a control terminal coupled to the output of the amplifier 348. The resistor 352 has a first terminal coupled to the supply voltage VDD, and a second terminal coupled to the first terminal of the transistor 350.

The voltage generator 228 includes a (first) transistor 354, a (second) transistor 356, and a (first) resistor 358. The transistor 354 has a first terminal coupled to the current input of the voltage generator, a second terminal coupled to ground, and a control terminal coupled to the first terminal. The transistor 356 has a first terminal coupled to the voltage output of the voltage generator 228, a second terminal coupled to ground, and a control terminal coupled to the control terminal of the transistor 354. The resistor 358 has a first terminal coupled to the supply voltage VDD, and a second terminal coupled to the first terminal of the transistor 356.

The gate driver 230 includes a (first) amplifier 360 and a (first) current source 362. The amplifier 360 has a first input coupled to the first voltage input of the gate driver 230, a second input coupled to the second voltage input of the gate driver 230, and an output coupled to the voltage output of the gate driver. The current source 362 has a first terminal coupled to the first input of the amplifier 360, and a second terminal coupled to ground. The current source 362 sources a current $I_B$, which may be a direct current (DC) bias current that is chosen such that the transistor 214 is properly biased even for small current flow at the output 118 or 204.

The current generator 302 has a voltage input coupled to the fourth feedback terminal (e.g., the node with $V_{fb4}$) of the output driver 203, and a current output. The current generator 302 includes a (first) amplifier 364, a (first) transistor 366, and a (first) resistor 368. The amplifier 364 has a first input coupled to the voltage input of the current generator 302, a second input, and an output. The transistor 366 has a first terminal coupled to the current output of the current generator 302, a second terminal coupled to the second input of the amplifier 364, and a control terminal coupled to the output of the amplifier 364. The resistor 368 has a first terminal coupled to the second terminal of the transistor 366 and a second terminal coupled to ground.

The voltage generator 304 has a current input coupled to the current output of the current generator 302, and a voltage output. The voltage generator 304 includes a (first) transistor 370, a (second) transistor 372, and a (first) resistor 374. The transistor 370 has a first terminal coupled to the supply voltage VDD, a second terminal, and a control terminal coupled to the second terminal. The transistor 372 has a first terminal coupled to the supply voltage VDD, a second terminal coupled to the voltage output of the voltage generator 304, and a control terminal coupled to the control terminal of the transistor 370. The resistor 374 has a first terminal coupled to the second terminal of the transistor 372, and a second terminal coupled to ground.

The gate driver 306 has a first voltage input coupled to the voltage output of the voltage generator 304, a second voltage input coupled to the third feedback terminal of the output driver 203 (e.g., the node with $V_{fb3}$), and a voltage output coupled to the second drive voltage input of the output driver 203. The gate driver 306 includes a (first) amplifier 376 and a (first) current source 378. The amplifier 376 has a first input coupled to the voltage output of the voltage generator 304, a second input coupled to the second voltage input of the gate driver 306, and an output coupled to the voltage output of the gate driver 306. The current source 378 has a first terminal coupled to the supply voltage VDD, and a second terminal coupled to the first input of the amplifier 376.

The current source 378 sources a current $I_B$, which may be a DC bias current that is chosen such that the transistor 337 is properly biased even for small current flow at the output 118 or 204.

As illustrated by connection 380, the controller 108 may by coupled to the control terminals of various transistors within the force amplifier 102 in order to control the operation of (e.g., turn on/off) the transistors. For example, the controller 108 may be coupled to the control terminals of the transistors 314, 316, 320, 322, 324, 326, 340, 342, etc.

Figure 4:
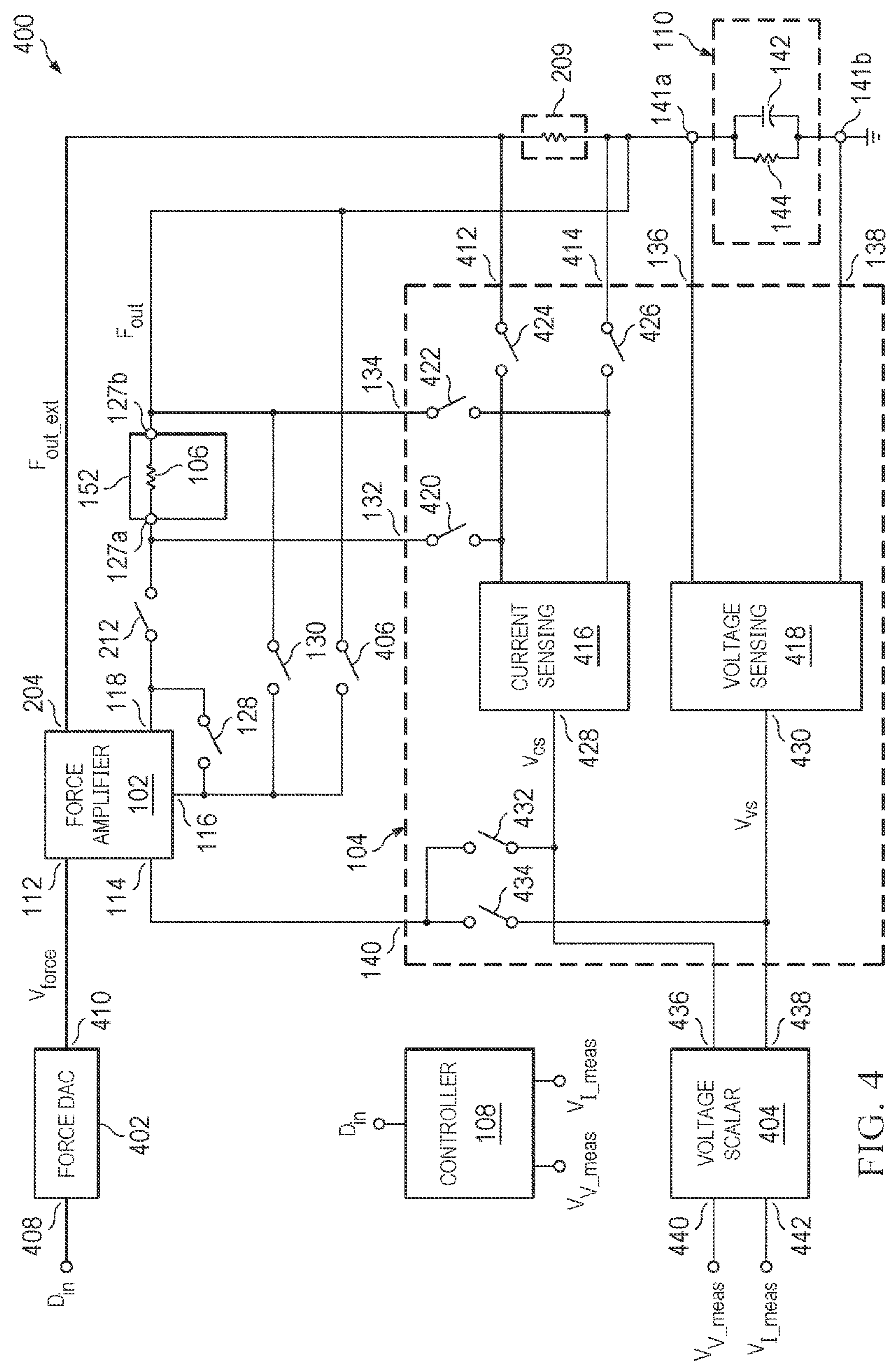
FIG. 4 is a circuit schematic illustrating another example SMU.

FIG. 4 illustrates an example of an SMU 400. In some examples, the SMU 400 corresponds to a more detailed version of the SMU 100, 200, or 300, and contains similarly numbered elements that have similar functionalities as those previously described.

In addition to the force amplifier 102, the IV sensing circuit 104, and the controller 108, the SMU 400 of FIG. 4 further includes a force digital to analog converter (DAC) 402, a voltage scalar circuit 404, and a switch 406.

The force DAC 402 has a digital input 408 upon which a signal $D_{in}$ is received, and an analog output 410 upon which the voltage $V_{force}$ is provided. The digital input 408 is coupled to the controller 108, and the output 410 is coupled to the voltage input 112 of the force amplifier 102.

The switch 406 has a first terminal coupled to the voltage input 116 of the force amplifier and a second terminal coupled to the first terminal of the resistor 209. In some examples, the switch 406 is closed when operating in force current mode while utilizing the output 204, and open otherwise.

In addition to the (first) voltage input 132, (second) voltage input 134, (third) voltage input 136, and (fourth) voltage input 138, the IV sensing circuit 104 has a (fifth) voltage input 412 and a (sixth) voltage input 414. The voltage input 412 is coupled to the first terminal of the resistor 209, and the voltage input 414 is coupled to the second terminal of the resistor 209.

The IV sensing circuit includes a current sensing circuit 416 and a voltage sensing circuit 418. The current sensing circuit 416 has first and second inputs coupled to the voltage inputs 132, 134, 412, 414 via (first), (second), (third), and (fourth) switches 420, 422, 424, 426 respectively. The switches 420, 422 may be closed when sensing current through the device under test 110 while utilizing the output 118, and open otherwise. The switches 424, 426 may be closed when sensing current through the device under test 110 and utilizing the output 204, and closed otherwise. The current sensing circuit 416 provides a voltage $V_{cs}$ at an output 428 of the current sensing circuit based on the sensed current. The voltage sensing circuit has first and second inputs coupled to the voltage inputs 136, 138 respectively. The voltage sensing circuit provides a voltage $V_{vs}$ at an output 430 of the voltage sensing circuit based on a voltage sensed across the device under test 110.

The IV sensing circuit 104 further includes (fifth) and (sixth) switches 432, 434. The switch 432 has a first terminal coupled to the output 428, and a second terminal coupled to the output 140. The switch 434 has a first terminal coupled to the output 430, and a second terminal coupled to the output 140. In some examples, the switch 432 is closed in force current mode and open in force voltage mode, and the switch 434 is open in force current mode and closed in force voltage mode.

The voltage scalar circuit 404 has a (first) voltage input 436, a (second) voltage input 438, a (first) voltage output 440, and a (second) voltage output 442. The voltage outputs 440, 442 are coupled to the controller 108, which may be used to provide voltage and/or current measurements to the controller 108. The voltage scalar circuit provides a voltage $V_{V\_meas}$ based on a voltage received at the voltage input 436, and a voltage $V_{I\_meas}$ based on a voltage received at the voltage input 438. In some examples, $V_{V\_meas}$ and $V_{I\_meas}$ are scaled down versions of voltages received at the inputs 436, 438. For example, a voltage across the device under test 110 may be as high as 45 Volts, such that $V_{vs}$ is approximately 45 Volts. Similarly, a current through the device under test 110 may be high, resulting in a high voltage $V_{cs}$. Such high voltages may not be supported by the controller 108. Thus, the high voltages may be scaled down (e.g., to between 0-5 Volts) by the voltage scalar circuit 404 to produce $V_{V\_meas}$ and/or $V_{I\_meas}$ before being received by the controller 108.

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms “terminal”, “node”, “interconnection”, “pin” and “lead” are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term “integrated circuit” means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase “ground” in the foregoing description include a chassis ground, an Earth ground, a floating ground, a virtual ground, a digital ground, a common ground, and/or any other form of ground connection applicable to, or suitable for, the teachings of this description. Unless otherwise stated, “about.” “approximately,” or “substantially” preceding a value means+/−10 percent of that parameter.

Modifications are possible in the described examples, and other implementations are possible, within the scope of the claims.

What is claimed is:

1. A circuit, comprising:

an amplifier, including:

a voltage input circuit having a first input, a second input, a first output, and a second output;

an output driver having a first input coupled to the first output of the voltage input circuit, a second input coupled to the second output of the voltage input circuit, a feedback input distinct from the first input and the second input, and an output;

a first feedback circuit having a first terminal coupled to the output of the output driver, and a second terminal coupled to the second input of the voltage input circuit;

a sensing resistor having a first terminal coupled to the output of the output driver, and a second terminal; and a first switch having a first terminal coupled to the second terminal of the sensing resistor, and a second terminal coupled to the feedback input of the output driver.

2. The circuit of claim 1, further comprising a second switch having a first terminal coupled to the first terminal of the sensing resistor and a second terminal coupled to the feedback input of the output driver.

3. The circuit of claim 1, further comprising:

a first capacitor having a first terminal and a second terminal;

a first resistor having a first terminal coupled to the second terminal of the first capacitor, and a second terminal coupled to the first input of the output driver;

a second capacitor having a first terminal and a second terminal; and a second resistor having a first terminal coupled to the second terminal of the second capacitor, and a second terminal coupled to the second input of the output driver.

4. The circuit of claim 1, wherein the output driver further comprises a first feedback terminal, a second feedback terminal, and a third input; and wherein the amplifier further comprises:

a current generator having an input coupled to the first feedback terminal of the output driver, and an output;

a voltage generator having an input coupled to the output of the current generator, and an output; and a gate driver having a first input coupled to the output of the voltage generator, a second input coupled to the second feedback terminal of the output driver, and an output coupled to the third input of the output driver.

5. The circuit of claim 4, wherein the output driver comprises:

a first resistor having a first terminal coupled to a supply voltage, and a second terminal;

a first transistor having a first terminal coupled to the second terminal of the first resistor, and a second terminal;

a second transistor having a first terminal coupled to the second terminal of the first transistor, and a second terminal coupled to the output of the output driver;

a third transistor having a first terminal coupled to the second terminal of the first transistor, and a second terminal coupled to a second output of the output driver;

a third switch having a first terminal coupled to a control terminal of the second transistor and a second terminal coupled to the output of the gate driver; and a fourth switch having a first terminal coupled to a control terminal of the third transistor and a second terminal coupled to the output of the gate driver.

6. The circuit of claim 5, wherein the output driver further comprises:

a first current source having a first terminal coupled to the supply voltage, and a second terminal;

a fourth transistor having a first terminal coupled to the second terminal of the first current source, and a second terminal;

a fifth transistor having a first terminal coupled to the second terminal of the fourth transistor, and a second terminal;

a second current source having a first terminal coupled to the second terminal of the fifth transistor, and a second terminal; and a first capacitor having a first terminal coupled to the second terminal of the fourth transistor, and a second terminal coupled to the feedback input of the output driver.

7. The circuit of claim 4, wherein the current generator comprises:

a first amplifier having a first input coupled to the input of the current generator, a second input, and an output;

a first transistor having a first terminal coupled to the second input of the first amplifier, a second terminal coupled to the output of the current generator, and a control terminal coupled to the output of the first amplifier; and a first resistor having a first terminal coupled to a supply voltage, and a second terminal coupled to the first terminal of the first transistor.

8. The circuit of claim 4, wherein the voltage generator comprises:

a first transistor having a first terminal coupled to the input of the voltage generator, a second terminal coupled to ground, and a control terminal coupled to the first terminal;

a second transistor having a first terminal coupled to the output of the voltage generator, a second terminal coupled to ground, and a control terminal coupled to the control terminal of the first transistor; and a first resistor having a first terminal coupled to a supply voltage, and a second terminal coupled to the first terminal of the second transistor.

9. The circuit of claim 4, wherein the gate driver comprises:

a first amplifier having a first input coupled to the first input of the gate driver, a second input coupled to the second input of the gate driver, and an output coupled to the output of the gate driver; and a first current source having a first terminal coupled to the first input of the first amplifier, and a second terminal coupled to ground.

10. The circuit of claim 1, wherein the voltage input circuit comprises:

a first current source having a first terminal coupled to a supply voltage, and a second terminal;

a first transistor having a first terminal coupled to the second terminal of the first current source, a second terminal, and a control terminal coupled to the first input of the voltage input circuit;

a second transistor having a first terminal coupled to the second terminal of the first current source, a second terminal, and a control terminal coupled to the second input of the voltage input circuit;

a third transistor having a first terminal coupled to the supply voltage, a second terminal, and a control terminal coupled to the second terminal;

a fourth transistor having a first terminal coupled to the second terminal of the third transistor, and a second terminal coupled to the second terminal of the second transistor;

a second current source having a first terminal coupled to the second terminal of the fourth transistor, and a second terminal coupled to ground;

a fifth transistor having a first terminal coupled to the supply voltage, a second terminal coupled to the first output of the voltage input circuit, and a control terminal coupled to the control terminal of the third transistor;

a sixth transistor having a first terminal coupled to the second terminal of the fifth transistor, and a second terminal;

a seventh transistor having a first terminal coupled to the second terminal of the fifth transistor, and a second terminal coupled to the second terminal of the sixth transistor;

an eighth transistor having a first terminal coupled to the second terminal of the sixth transistor and coupled to the second output of the voltage input circuit, and a second terminal coupled to the second terminal of the first transistor; and a third current source having a first terminal coupled to the second terminal of the eighth transistor, and a second terminal coupled to ground.

11. The circuit of claim 1, wherein the first feedback circuit includes a voltage sensing circuit having a first input coupled to a first testing input terminal, a second input coupled to a second testing input terminal, and an output coupled to the second input of the voltage input circuit.

12. The circuit of claim 1, wherein the first feedback circuit includes a current sensing circuit having a first input coupled to the first terminal of the sensing resistor, a second input coupled to the second terminal of the sensing resistor, and an output coupled to the second input of the voltage input circuit.

13. The circuit of claim 1, wherein the output driver further has a second output, and wherein the circuit further comprises a third switch having a first terminal coupled to the second output of the output driver and a second terminal coupled to the feedback input of the output driver.

14. A circuit, comprising:

an amplifier, comprising:

a voltage input circuit having a first input, a second input, a first output, and a second output;

an output driver having a first input coupled to the first output of the voltage input circuit, a second input coupled to the second output of the voltage input circuit, a third input, a feedback input, and an output;

a first current generator having an input coupled to a first feedback terminal of the output driver, and an output;

a first voltage generator having an input coupled to the output of the first current generator, and an output; and a first gate driver having a first input coupled to the output of the first voltage generator, a second input coupled to a second feedback terminal of the output driver, and an output coupled to the third input of the output driver.

15. The circuit of claim 14, wherein the output driver further comprises a fourth input, and wherein the amplifier further comprises:

a second current generator having an input coupled to a third feedback terminal of the output driver, and an output;

a second voltage generator having an input coupled to the output of the second current generator, and an output; and a second gate driver having a first input coupled to the output of the second voltage generator, a second input coupled to a fourth feedback terminal of the output driver, and an output coupled to the fourth input of the output driver.

16. The circuit of claim 14, further comprising:

a resistor having a first terminal coupled to the output of the output driver, and a second terminal;

a first switch having a first terminal coupled to the first terminal of the resistor, and a second terminal coupled to the feedback input of the output driver; and a second switch having a first terminal coupled to the second terminal of the resistor, and a second terminal coupled to the feedback input of the output driver.

17. The circuit of claim 16, further comprising a feedback circuit extending from the output of the output driver to the second input of the voltage input circuit.

18. A circuit, comprising:

a force amplifier having a first input, a second input, a feedback input, and an output;

a first feedback circuit having a first terminal coupled to the output of the force amplifier, and a second terminal coupled to the second input of the force amplifier;

wherein the first feedback circuit includes a sensing resistor having a first terminal coupled to the first terminal of the first feedback circuit, and a second terminal;

a first switch having a first terminal coupled to the first terminal of the sensing resistor, and a second terminal coupled to the feedback input of the force amplifier; and a second switch having a first terminal coupled to the second terminal of the sensing resistor, and a second terminal coupled to the feedback input of the force amplifier;

wherein the force amplifier is configured to operate in a force voltage mode in which a voltage at the output of the force amplifier is constant or a force current mode in which a current at the output of the force amplifier is constant, wherein the first switch is open and the second switch is closed in the force voltage mode, and wherein the first switch is closed and the second switch is open in the force current mode.

19. The circuit of claim 18, wherein the force amplifier comprises:

a current generator configured to generate a current based on a current at the output of the force amplifier;

a voltage generator coupled to the current generator, wherein the voltage generator is configured to generate a voltage based on the current generated by the current generator; and a gate driver coupled to the voltage generator, wherein the gate driver is configured to provide a bias voltage to a control terminal of a transistor of the force amplifier based on the voltage generated by the voltage generator, wherein the transistor is coupled to the output of the force amplifier.

20. The circuit of claim 19, wherein the first feedback circuit further comprises:

a current voltage (IV) sensing circuit, wherein the IV sensing circuit is configured to provide a feedback voltage to the second input of the force amplifier in the force voltage mode, and wherein the IV sensing circuit is configured to provide a feedback current to the second input of the force amplifier in the force current mode.

* * * * *